United States Patent
Fu et al.

(10) Patent No.: US 8,121,444 B2
(45) Date of Patent: Feb. 21, 2012

(54) OPTICALLY AND ELECTRICALLY ACTUATABLE DEVICES

(75) Inventors: Kai-Mei Camilla Fu, Stanford, CA (US); Charles M. Santori, Palo Alto, CA (US); Matthew D. Pickett, San Francisco, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 391 days.

(21) Appl. No.: 12/430,061

(22) Filed: Apr. 24, 2009

(65) Prior Publication Data

US 2010/0272386 A1     Oct. 28, 2010

(51) Int. Cl.
  G02B 6/12     (2006.01)
  H01L 27/14    (2006.01)
  H01L 31/0232  (2006.01)
(52) U.S. Cl. .................... 385/14; 257/431; 257/432
(58) Field of Classification Search .............. None
See application file for complete search history.

(56) References Cited

U.S. PATENT DOCUMENTS

| 5,933,365 | A |   | 8/1999  | Klersy et al.           |
| 6,087,651 | A | * | 7/2000  | Koyama ......... 250/214.1 |
| 7,365,355 | B2 |  | 4/2008  | Parkinson               |
| 7,366,030 | B2 |  | 4/2008  | Campbell et al.         |
| 7,483,316 | B2 |  | 1/2009  | Chen et al.             |
| 7,499,315 | B2 |  | 3/2009  | Lowrey et al.           |
| 8,054,669 | B2 | * | 11/2011 | Meijer et al. ......... 365/119 |
| 2008/0048167 | A1 |  | 2/2008 | Kostylev et al.         |

FOREIGN PATENT DOCUMENTS

EP     2184793 A1 *  5/2010
WO  WO 2009020210 A1 *  2/2009

OTHER PUBLICATIONS

Kennedy, C.E., "Review of Mid- to High-Temperature Solar Selective Absorber Materials", NREL/TP-520-31267, Jul. 2002, pp. 1-51.

* cited by examiner

*Primary Examiner* — Omar Rojas (57) ABSTRACT

Disclosed herein are optically and electrically actuatable devices. The optically and electrically actuatable device includes an insulating substrate, two electrodes, an active region, and a concentrator. At least one of the two electrodes is established on the insulating substrate, and another of the two electrodes is established a spaced distance vertically or laterally from the at least one of the two electrodes. The other of the two electrodes is an optical input electrode. The active region is established between or beneath the two electrodes. The concentrator is optically coupled to the optical input electrode for concentrating incident light such that a predetermined portion of the active region is optically actuatable.

21 Claims, 3 Drawing Sheets

OPTICALLY AND ELECTRICALLY ACTUATABLE DEVICES

BACKGROUND

The present disclosure relates generally to optically and electrically actuatable devices.

Nanometer-scale crossed-wire switching devices have previously been reported that could be switched reversibly and had an ON-to-OFF conductance ratio of about $10^3$. Such devices have been used to construct crossbar circuits and provide a promising route for the creation of ultra-high density nonvolatile memory. A latch (which is an important component for logic circuits and for communication between logic and memory) has been fabricated from a series connection of crossed-wire switches. New logic families, constructed entirely from crossbar arrays of switches or as hybrid structures composed of switches and transistors, have also been described. These new logic families have the potential to dramatically increase the computing efficiency of CMOS circuits.

BRIEF DESCRIPTION OF THE DRAWINGS

Features and advantages of embodiments of the present disclosure will become apparent by reference to the following detailed description and drawings, in which like reference numerals correspond to the same or similar, though perhaps not identical, components. For the sake of brevity, reference numerals having a previously described function may or may not be described in connection with subsequent drawings in which they appear.

DETAILED DESCRIPTION

Embodiments of the lateral and vertical memristive devices disclosed herein are advantageously able to be optically switched and then electrically read and reset. Some embodiments of the device include light absorbers or other light concentrators that enable the device to be programmed while in an electrically passive state. As such, the switching event may be accomplished while the device is consuming no electrical power.

Very generally, in the embodiments disclosed herein, the optically and electrically actuatable device includes an insulating substrate, electrodes and active region optically and electrically coupled thereto, and a concentrator. The electrodes may be configured vertically or laterally. One of the electrodes is an optical input electrode that is optically coupled to a concentrator in a manner sufficient to concentrate incident light such that a predetermined portion of the active region is optically actuatable. As discussed hereinbelow in reference to the various Figures, the concentrator may be a waveguide, an absorbing layer (alone or in combination with an anti-reflective coating), an optical cavity, or combinations thereof.

The active region is capable of transporting and hosting ions that act as dopants to control the flow of electrons through the device. The basic mode of operation of the device is to direct light toward an absorbing component of the device, whereby the device is heated to a temperature sufficient to cause mobile dopants to be transported within the active region via ionic transport, thereby forming a conductive channel or breaking up a conductive channel formed between two electrodes. The mobile dopants are generally an ionic species that change the electrical conductivity of the active region from low conductivity (i.e., an undoped semiconductor or insulator—switch-OFF configuration) to high conductivity (doped to provide a higher conductivity—switch-ON configuration) or from high electrical conductivity to low conductivity (switch-ON to switch-OFF). As such, the reconfiguration of the dopant profile in response to an optical stimulation pulse changes the electrical transport behavior of the junction. Since an optical pulse is used, the physical process by which the change in the electrical characteristics is brought about is heating. The embodiments disclosed herein are configured to maximize optical absorption at a single device/detector and minimize heating to neighboring devices.

The material for the active region and the dopants are selected such that the drift of the mobile dopants into or out of the active region is possible, but not too facile. This generally ensures that the device will remain in whatever state it is set for a reasonably long time. This also contributes to the device being nonvolatile (i.e., it holds its state after the incident light has been removed). As such, an optically initiated switching event may be read electronically at a time subsequent to the actual occurrence of the switching event.

The various lateral and vertical configurations of the device are further described in reference to the Figures.

Figure 1:
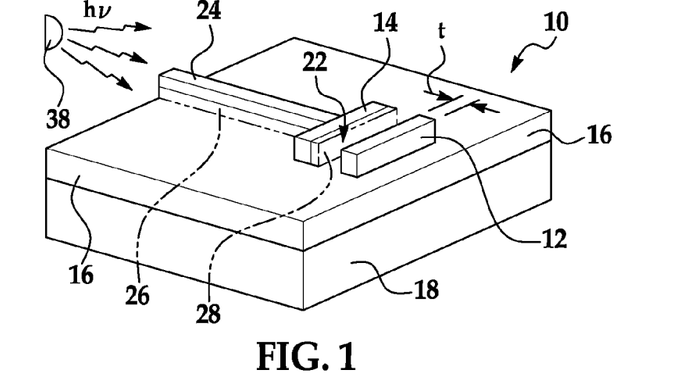
FIG. 1 is a semi-schematic perspective view of an embodiment of a lateral device.

Referring now to FIG. 1, an embodiment of the lateral device 10 is depicted. This embodiment of the device 10 includes two electrodes 12, 14 established on an active region 16. In all of the embodiments disclosed herein, one of the electrodes 12 or 14 (or 30 or 32, discussed further hereinbelow) is an optical input electrode. The term "optical input electrode" refers to the electrode in the device that is initially exposed to light. The optical input electrodes is at least partially transparent so that at least some of the light incident thereon is transmitted to the other electrode, and/or an absorber, and/or the active region 16 in the device 10. The embodiment shown in FIG. 1 also includes an absorbing electrode, which is capable of absorbing at least 25% of light incident thereon. Some electrodes 12, 14, 30, 32 may be both partially transparent and partially absorbing.

In the embodiment shown in FIG. 1, both electrodes 12, 14 are absorbing electrodes, and the electrode 14 is the optical input electrode. In this embodiment of the device 10, the electrodes 12, 14 are each formed of metals having a predetermined thickness t. The thickness t is generally large enough to render the conductive material absorbent enough to efficiently heat the adjacent active region 16 when exposed to an optical pulse. In one non-limiting example, the thickness t of the electrodes 12, 14 is equal to or greater than 200 nm. Materials that are suitable for the electrodes 12, 14 include gold, platinum, tungsten, copper, etc.

The electrodes 12, 14 may be fabricated using conventional techniques, such as photolithography or electron beam lithography, or by more advanced techniques, such as imprint lithography.

The absorbing electrodes 12, 14 are established on the active region 16. As previously mentioned, in one embodiment, the active region 16 is capable of transporting and hosting ions that act as dopants to control the flow of electrons through the device 10. It is to be understood that in another embodiment, phase change materials (e.g., chalcogenides) may be used as the active region 16. Non-limiting examples of suitable materials for the active region 22 include oxides, chalcogenides (e.g., sulfides, selenides, etc.), nitrides, phosphides, arsenides, chlorides, and bromides of silicon, transition metals, rare earth metals, or alkaline earth metals. Further, there are the various alloys of like compounds with each other, which offer a wide range of compositions if they are mutually soluble in each other. There are also mixed compounds, in which there are two, three or more different metal atoms combined with some number of the electronegative elements. In such instances, the mobile dopants formed may be anion vacancies or different valence elements.

Materials for the active region 16 including the elements Ti, Zr and Hf are particularly attractive because they can be compatible with Si integrated circuit technology, since the primary oxidation state of all three metals is +4, the same as Si. As such, these elements would not create unintentional doping of the Si. These compounds are also known as titania, zirconia, and hafnia, respectively, and also by other names specific to the various polytypes of each. Still another embodiment includes the alloys of these three oxides in pairs or with all three present simultaneously (e.g., $Ti_xZr_yHf_zO_2$, where x+y+z=1). Related sets of compounds include the titanates, zirconates and hafnates, which are represented by the specific example $SrTiO_3$, where Sr is the divalent element strontium. There is a wide variety of such compounds in which Ca, Ba, and other divalent elements (e.g., Mg, Zn, Cd) may be substituted for Sr, and Zr and Hf substituted for Ti. These compounds may be represented as $ABO_3$ compounds, where A is at least one divalent element and B is at least one of Ti, Zr, and Hf, and may have the perovskite structure.

It is also possible to utilize alloys of these various compounds, such as $Ca_aSr_bBa_cTi_xZr_yHf_zO_3$, where a+b+c=1 and x+y+z=1. There is also a wide variety of other oxides of the transition and rare earth metals with different valencies that may be used, both individually and as more complex compounds. In each case, the mobile dopants may be an oxygen vacancy or an aliovalent (e.g., different valence) element.

Yet another embodiment of compounds suitable for the active region 16 includes the sulfides and selenides of the transition metals with some ionic bonding character, essentially the S and Se analogues of the oxides mentioned above. Still another embodiment of compounds suitable for the active region 16 includes the semiconducting nitrides, such as AlN, GaN, ScN, YN, LaN, rare earth nitrides, and alloys of these compounds and more complex mixed metal nitrides. A still further embodiment of compounds suitable for the active region 16 includes the semiconducting halides (such as CuCl, CuBr, and AgCl), or the phosphides and arsenides of various transition and rare earth metals, e.g., Sc, Y, La, etc. In each of the examples set forth in this paragraph, either anion vacancies or aliovalent elements may be formed as the mobile dopants.

It is to be further understood that the active region 16 may include sublayers of different materials or compounds chosen from the examples above.

The dopants employed in the embodiments disclosed herein may be hydrogen, alkali, and alkaline earth cations, transition metal cations, rare earth cations, oxygen anions or vacancies, chalcogenide anions or vacancies, nitrogen anions or vacancies, pnictide anions or vacancies, or halide anions or vacancies. Specific non-limiting examples of mobile dopant anions include carbon anions, sulfur anions, or phosphorus anions, and specific non-limiting examples of mobile dopant cations include aluminum cations, niobium cations, copper cations, and silver cations.

Specific examples of the active region 16 and mobile dopants introduced therein are shown in Table 1.

TABLE 1

Examples of Active Regions and Mobile Dopants

| Active Region | Mobile Dopant |
|---|---|
| $TiO_{2-x}$ | Oxygen vacancies or metal interstitials |
| $ZrO_{2-x}$ | Oxygen vacancies or metal interstitials |
| $HfO_{2-x}$ | Oxygen vacancies or metal interstitials |
| $SrTiO_{3-x}$ | Oxygen vacancies or metal interstitials |
| $GaN_{1-x}$ | Nitrogen vacancies |
| $CuCl_{1-x}$ | Chlorine vacancies or copper interstitials |
| GaN:S | Sulfide ions |
| $NiO_{2-x}$ | Oxygen vacancies or metal interstitials |

Suitable deposition techniques for the active region 16 include conventional physical and chemical techniques, including electron-beam evaporation, evaporation from a Knudsen cell, filament, or crucible, sputtering from a target, chemical vapor deposition (CVD), molecular beam deposition, atomic layer deposition, or various other forms of chemical vapor or beam growth from elements, compounds, or reactive precursors. Appropriate deposition or growth conditions, such as speed and temperature, may be selected to achieve the desirable chemical composition and local atomic structure desired for the active region 16.

The mobile dopants may be introduced via an electroformation step. For example, a voltage may be applied across the active region to generate, for example, oxygen vacancies within the region 16. It is to be understood that other processes (ion implantation) may be used to introduce the dopants within the region 16.

In the embodiment shown in FIG. 1, it is to be understood that the electrodes 12, 14 are also established such that at least some of the active region 16 is exposed between the two electrodes 12, 14. This portion of the active region 16 is referred to herein as the junction 22. The junction 22 is the area of the active region 16 where the mobile dopants are transported as a result of exposure to optical pulses or electrical pulses (e.g., where the optical pulses are used to program the device and where the electrical pulses are used to read and reset the device). Such exposure switches the conductive channel within the junction from an ON state or an OFF state to the other of the OFF state or the ON state. In one non-limiting example, optical pulses are used to switch the device 10 to its OFF state and electrical pulses are used to switch the device 10 to its ON state.

Also as shown in FIG. 1, the active region 16 is established on an insulating substrate 18. Non-limiting examples of suitable insulating substrates 18 include glass, quartz, ceramic (alumina), etc. The insulating substrate 18 is utilized, at least in part, to assist in concentrating the heat within the active region 16 at the junction 22 between the two electrodes 12, 14.

In order to assist in selectively and effectively heating the junction 22, a waveguide 24 is established on the active region 16 such that it is in optical communication with the optical input electrode 14. Non-limiting examples of suitable waveguide materials include silicon, silicon dioxide, silicon nitride, titanium dioxide, silicon carbide, or III-V semiconductors. Light is directed from a light source 38 through the waveguide 24 (i.e., the waveguide 24 is not absorbing at the operating wavelength) to the optical input electrode 12, 14. Light absorbed by the optical input electrode 14 heats the electrode 14, while light transmitted through the electrode 14 may be absorbed by the electrode 12, thereby heating the electrode 12. The heated electrodes 12, 14 in turn heat the active region 16 adjacent to the electrodes 12, 14, and cause mobile dopants within the adjacent active region 16 (i.e., the junction 22) to form the conductive channel and switch the device 10. When a phase change material is used for the active region 16, the heat initiates the phase change.

The waveguide 24 is also optically insulated from the active region 16. By "optically insulated," it is meant that the waveguide 24 has a geometry and refractive index configured to support at least one guided optical mode, and/or that the device 10 includes an optical buffer layer 26 established between the active region 16 and the waveguide 24, where the optical buffer layer 26 has a thickness that is at least one half of the optical wavelength of the light to be guided through the waveguide 24 so as to reduce optical loss into the active region 16 to an acceptable level. In the former embodiment, optical guiding (optical insulation of the waveguide 24) is achieved by using the waveguide 24 that has an index of refraction that is greater than the index of refraction of the active region 16. As one non-limiting example, the waveguide 24 is silicon and the active region 16 is $TiO_{2-x}$ (operation wavelength greater than 1.3 microns). This non-limiting example may not be desirable for visible wavelengths, but rather a waveguide 24 with an even larger bandgap may be more desirable. In the latter embodiment (as an alternative to or in addition to the varying indices of refraction of the waveguide 24 and active region 16), the optical guiding (optical insulation of the waveguide 24) is achieved by incorporating the optical buffer layer 26, which has a lower refractive index than the waveguide 24, between the waveguide 24 and the active region 16. As one non-limiting example, the waveguide 24 is silicon or silicon nitride (e.g., the latter of which may be used for visible wavelength operations), the optical buffer layer 25 is silicon dioxide, and the active region 16 is $TiO_{2-x}$. It is to be understood that the optical buffer layer 26 is generally used if either the active region 16 is absorbing, or if the active region 16 has a higher refractive index than that of the waveguide 24.

In the embodiment of FIG. 1, an absorber 28 (also referred to herein as an optical absorbing layer) is shown positioned between the absorbing electrodes 12, 14. While not shown in the Figures, it is to be understood that the absorber 28 may also be positioned between the waveguide 24 and the optical input electrode 14. The absorber 28 is selected to optically absorb wavelengths within one or more desirable wavebands. Non-limiting examples of such an absorber 28 are poly-silicon or boron doped silicon. The absorber 28 may further enhance the concentration of heat adjacent to the junction 22, and (when positioned between the electrodes 12, 14) may also enable current flow through the device 10. Furthermore, when established between the electrodes 12, 14, the absorber 28 may fill the entire junction 22 or a portion of the junction 22. For the lateral geometry, if the absorber 28 fills the entire junction 22 (i.e., the absorber 28 contacts both electrodes 12, 14), the material is selected to be non-conductive in order to avoid shorting the device 10. In any of the embodiments, it is to be understood that the absorber 28 material and/or the positioning of the absorber 28 is chosen so as to avoid shorting out the junction 22. The absorber 28 material is also selected such that it absorbs at least 50% of the light transmitted from the light source 38 and/or through the optical input electrode 14 (or 12 as shown in FIG. 2, or 32 as shown in FIGS. 3 through 8).

When the absorber 28 is included in the embodiment of FIG. 1, it is to be understood that it has a cross-section that is sufficient to have incident thereon an entire optical beam from the waveguide 24. Furthermore, when the absorber 28 is included in the device 10 between the electrodes 12, 14, it is to be understood that the optical input electrode 14 (or 12) is at least partially transparent so that light is transmitted through to the absorber 28.

When the absorber 28 is not included in the device 10, it is to be understood that the electrodes 12, 14 may, in some instances, be configured to absorb enough light to sufficiently heat the device 10. For example, the thickness of the electrodes 12, 14 may be increased so that they are more absorbing and less transmissive and/or reflective at the operating wavelengths. This embodiment of the device 10 may be suitable for a low efficiency regime.

Figure 2:
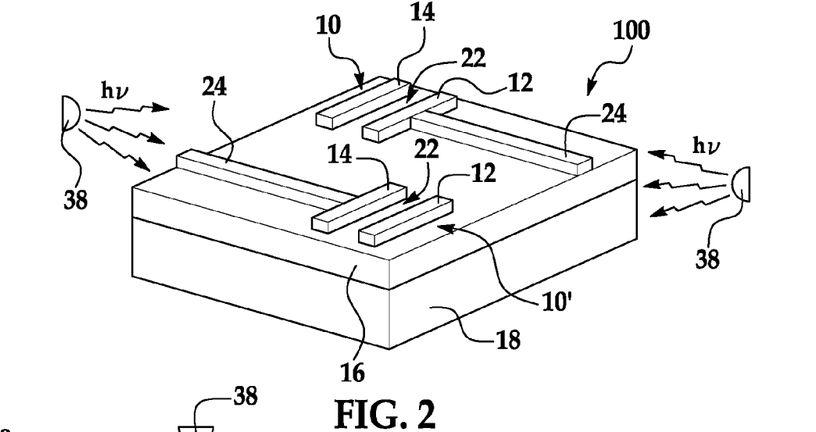
FIG. 2 is a semi-schematic perspective view of an embodiment of an array including a plurality of lateral devices.

Referring now to FIG. 2, an array 100 is shown in which multiple devices 10, 10' are established on a single substrate 18 and on a single active region 16. Each device 10, 10' is formed using the materials and methods described for the embodiment of FIG. 1. Any number of devices 10, 10' may be incorporated onto the substrate 18 and active region 16. Generally, the number of devices 10, 10' that may be included is not limited, except by the size of the substrate 18 and the size of each of the devices 10, 10'. Furthermore, the device 10, 10' may be included in an array 100 in which they act in parallel.

It is to be understood that by incorporating a plurality of devices 10, 10' into a single array 100 on a single active region 16, respective areas of the active region 16 may be selectively activated. For example, light may be directed toward the waveguide 24 of device 10, while device 10' remains in an optical detecting state, and vice versa. Likewise, light may be directed toward the waveguides 24 of each of the devices 10, 10', and thus the devices 10, 10' may be optically activated simultaneously.

When reading switching events within the array 100, it is to be understood that all devices 10, 10' may be read simultaneously, or devices 10, 10' may be selectively read. For example, the current or voltage of a single device 10, 10' may be measured in order to read that particular device 10, 10'. The devices 10, 10' may also be reset simultaneously, or devices 10, 10' may be selectively reset. For example, an appropriate voltage may be selectively applied across one or more of the respective junction(s) 22 in order to drive the dopants through the conduction channel and transmit the associated device(s) 10, 10' back into the optically active state.

Referring now to FIGS. 3 through 7, embodiments of the vertical device 20, 20', 20", 20''' are depicted. In these embodiments, the electrodes 30, 32 are stacked vertically on the insulating substrate 18, and the active region 16 is established at least in a junction 34 formed therebetween. In each of these embodiments, the outermost or top electrode 32 is the optical input electrode and is established on the active region 16 at a non-zero angle with respect to electrode 30. It is to be understood that in all of these embodiments, the description of the insulating substrate 18 and active region 16 described hereinabove in reference to FIG. 1 is applicable.

Figure 3:
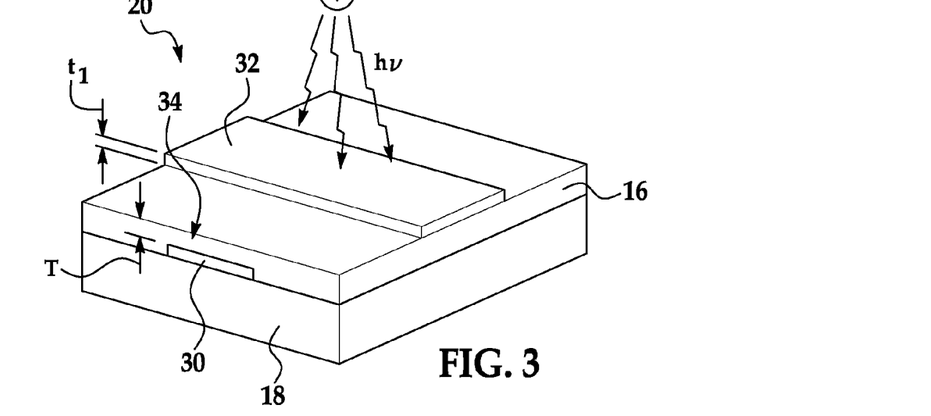
FIG. 3 is a semi-schematic perspective view of an embodiment of a vertical device.

Referring specifically to FIG. 3, a bottom electrode 30 is established directly on the substrate 18. This electrode 30 may be fabricated using conventional techniques, such as photolithography or electron beam lithography, or by more advanced techniques, such as imprint lithography. In one embodiment, the thickness of the bottom electrode 30 ranges from about 5 nm to about 30 nm. The bottom electrode 30 may be any suitable conductive material, such as gold, platinum, tungsten, copper, etc.

In this particular embodiment, the active region 16 is established at least on the bottom electrode 30, and, in some instances, on the insulating substrate 18 as well. The deposition of the active region 16 is particularly controlled such that a desirable thickness T is obtained. By controlling the distance between the electrodes 30, 32 via the thickness T, an optical cavity is created between the two electrodes 30, 32. The thickness T is selected so that when the device 10 (in its optically detecting state) is exposed to incident light, standing waves are created between the electrodes 30, 32. Generally, the thickness T is controlled such that a total optical path length between the two electrodes is ½ the wavelength of the incident light exposed to the cavity. In an embodiment, the thickness T ranges from about 100 nm to about 600 nm, depending upon the particular materials and wavelength(s) of light that are used. In the embodiment of FIG. 3, each of the electrodes 30, 32 is at least partially reflective, and thus may function as cavity mirrors. Such standing waves concentrate the incident light and enable the active region 16 to heat to a desirable temperature to cause switching from the optically detecting state to an optically non-detecting state.

This particular geometry also enables wavelength selectivity for the optical switching event. The resonant frequency of the optical cavity is dependent, at least in part, on the geometry of the cavity (i.e., in this embodiment, the distance between the two electrodes 30, 32). Thus, the distance between electrodes 30, 32 controls how strongly light is coupled into the system for a given wavelength. Thus, in one non-limiting example, a specific cavity could be configured to couple green light 100 times more efficiently than red light, and therefore the device 20 would only switch when green light is incident on the optical input electrode 32 and the cavity.

In this embodiment, the top electrode 32 (i.e., the optical input electrode) is a partially transparent electrode which transmits at least some light incident thereon through to the active region 16. It is to be understood that the amount of light transmitted by the electrode 32 is sufficient to heat the active region 16 adjacent the junction 34 and switch the device 10. As previously mentioned, in this embodiment it is also desirable that the partially transparent electrode 32 is also partially reflective. The thickness $t_1$ of the electrode 32 may be controlled to achieve the desirable reflective and transparent properties. In one embodiment, the thickness $t_1$ of the electrode 32 is selected so that the electrode 32 is 10% or more transparent. Such transparency may be achieved, for example, when the top partially transparent electrode 32 has a thickness $t_1$ ranging from 10 nm to 20 nm. Suitable materials for the partially transparent electrode 32 in this embodiment are titanium, gold, platinum, tungsten, copper, etc.

In embodiments including the cavity, it may be desirable to have the electrodes 30, 32 (or at least the optical input electrode 32) more reflective than transmissive. It is to be understood that the light on resonant with the cavity (e.g., the green light in the previous example) will still be transmitted through to heat the active region 16 when such electrodes 30, 32 are used.

Figure 4:
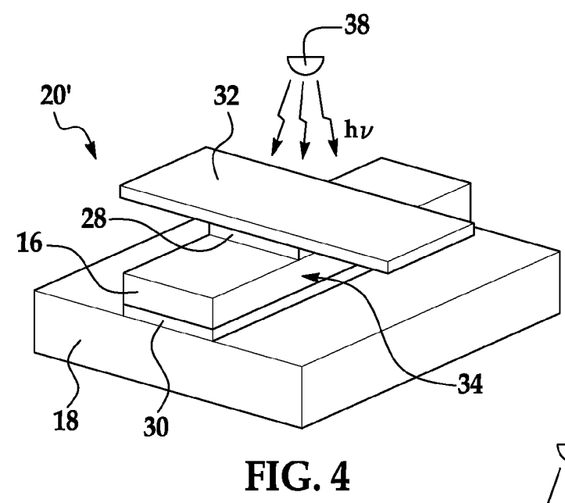
FIG. 4 is a semi-schematic perspective view of another embodiment of a vertical device.
Figure 5:
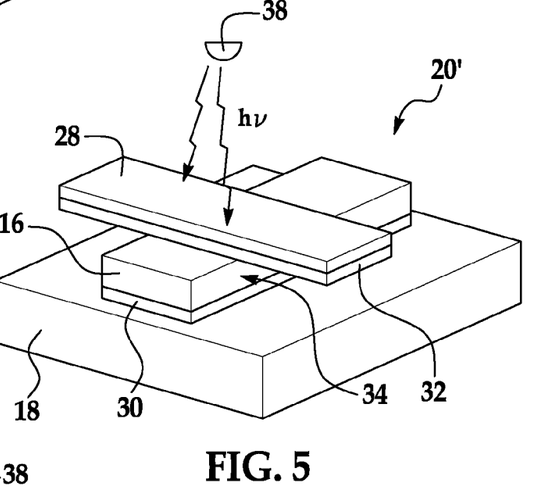
FIG. 5 is a semi-schematic perspective view of still another embodiment of a vertical device.

Referring now to FIGS. 4 and 5 specifically, other embodiments of the device 20' are depicted. In these embodiments, an absorber/optically absorbing layer 28 (similar to that previously described in reference to FIG. 1) is established between the active region 16 and the top substantially transparent electrode 32 (FIG. 4) or on the optical input electrode 32 (FIG. 5). In the embodiment of FIG. 4, it is desirable to include a conductive absorber 28 (such as poly-silicon, or doped silicon), and the optical input electrode 32 is substantially transparent. In the embodiment of FIG. 5, the absorber 28 may or may not be conducting and the optical input electrode 32 does not have to be substantially transparent. In one non-limiting example, the absorber 28 is one of the previously listed materials, or is a metal/dielectric composite material. Other suitable absorbers 28 for the embodiment shown in FIG. 5 include metal-semiconductor tandem absorbers, in which the semiconductor portion is porous (such absorbers are described in "Review of Mid- to High Temperature Solar Selective Absorber Materials", page 5, July 2002, the contents of which are incorporated by reference).

In the embodiment shown in FIGS. 4 and 5, the top substantially transparent electrode 32 may be completely transparent (e.g., indium tin oxide (ITO)) or may be thin enough to transmit at least 50% of the incident light therethrough (as described in reference to FIG. 3).

As shown in FIGS. 4 and 5, the absorber 28 is established in the junction 34 or on the top electrode 32 such that the concentration of heat adjacent to the junction 34 is enhanced. It is generally not desirable that the absorber 28 be established at areas outside the junction 34 or outside the width of the junction 34, at least in part because this would heat other areas of the active region 16. Furthermore, since the absorber 28 (positioned at or adjacent the junction 34) may also be electrically conductive, in such embodiments, current is allowed to flow therethrough during electrically actuation of the device 20'.

Figure 6:
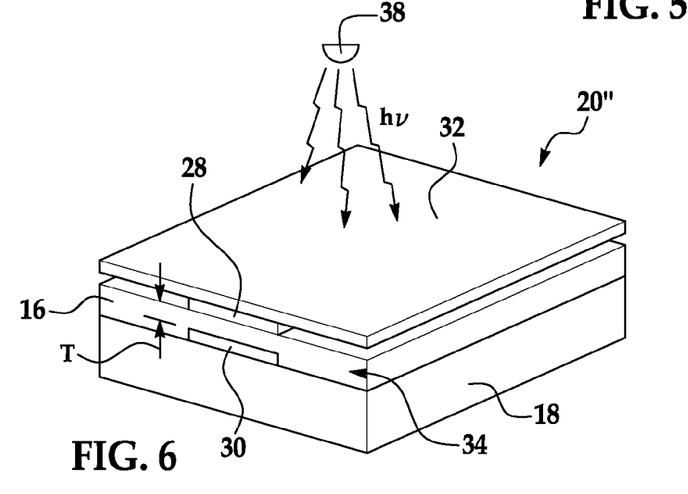
FIG. 6 is a semi-schematic perspective view of yet another embodiment of a vertical device.

The device 20" shown in FIG. 6 includes both the optimized thickness T (described in reference to FIG. 3) and the absorber 28 (described in reference to FIG. 4). Such heat concentrating mechanisms may be used together to efficiently heat the active region 16 at the junction 34 in order to optically switch the electrical properties of the device 20". It is to be understood that in the embodiment shown in FIG. 6, the completely transparent top electrode 32 may be less desirable (and a partially transparent electrode 32 more desirable), at least in part because of the standing waves created in the optical cavity between the electrodes 30, 32.

Figure 7:
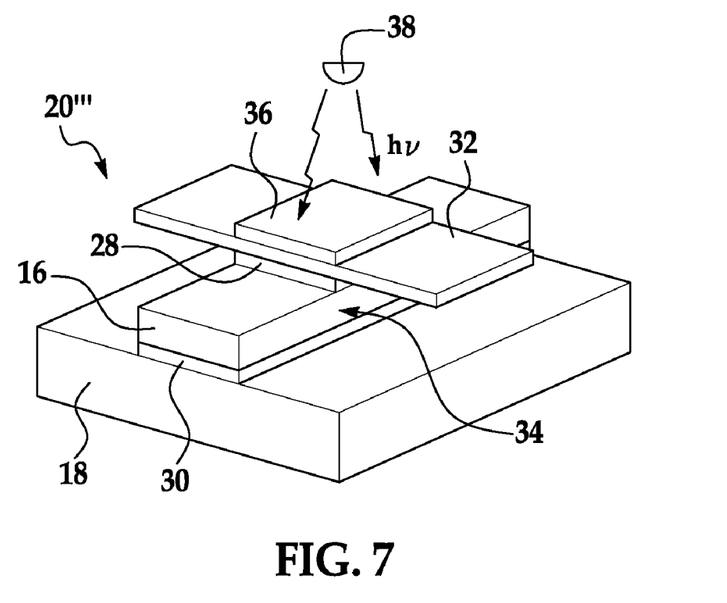
FIG. 7 is a semi-schematic perspective view of yet still another embodiment of a vertical device.

Still another embodiment of the device 20''' is shown in FIG. 7. This embodiment of the device 20''' includes the absorber 28 positioned in the junction 34 between the optical input electrode 32 and the active region 16, and an anti-reflective layer 36 positioned on the optical input electrode 32. In this embodiment, the optical input electrode 32 is generally a very thin metal (e.g., less than 20 nm) or a transparent material (e.g., ITO).

The anti-reflective layer 36 may also be established on the absorber 28 in embodiments in which the absorber 28 is positioned outside of the junction 22. For example, the anti-reflective layer 36 (discussed in reference to FIG. 7) may be established on the absorber 28 shown in FIG. 5.

Generally, the anti-reflective layer 36 is a thin film dielectric coating, having a thickness ranging from about 50 nm to about 2500 nm. In one non-limiting example, the anti-reflective layer 36 has a thickness ranging from about 200 nm to about 1000 nm. Non-limiting examples of suitable anti-reflective layers 36 include silicon nitride, silicon dioxide, zinc sulfide, zinc selenide, and cerium oxide. In some instances, titanium dioxide may also be a suitable anti-reflective material for layer 36. As a non-limiting example, the device 20''' may include ITO as the electrode 32, a lambda/4 ($\lambda/4$) $TiO_2$ anti-reflective layer 26, a silicon absorber 28, and any suitable active region 16 and bottom electrode 30. In another non-limiting example, a doped poly-silicon or boron-doped single crystal silicon is used as the absorber 28 in conjunction with any of the anti-reflective layers 26 listed hereinabove.

The anti-reflective layer 36 is similar to the previously described cavity in that is used to reduce and/or eliminate reflections from the absorber 28 at the operating wavelength. Since they have a similar function, it is generally not desirable to utilize the anti-reflective layer 36 with an embodiment that includes the cavity for standing waves created by virtue of the active region thickness T. Furthermore, the anti-reflective layer 36 may be used when the amount of light reflected off of the absorber 28 is undesirable. For example, some materials, such as boron doped silicon, will absorb all the light that is transmitted into the material. However, some of the light incident thereon is initially reflected, and this reflected light will be lost. In some instances, the amount of initially reflected light may be as high as about 30% (e.g., when single crystal silicon is used). When it is desirable to reduce the amount of light that is initially reflected off of the absorber 28, the anti-reflective layer 26 may be included.

While the anti-reflective layer 36 is not shown in the laterally oriented device 10, 10' of FIGS. 1 and 2, it is to be understood that such a layer may be included between the optical input electrode 14 and the waveguide 24.

In still other embodiments that are not shown in the drawings, the materials selected for the optical input electrode 32 (or 14 as described in FIG. 1) or the absorber 28 may be engineered such that the material is highly absorbing and less or not reflective. The previously mentioned porous semiconductor or metal/dielectric composites (discussed above in reference to FIG. 5) are examples of engineered materials that are suitable for the absorber 28. Another example of such engineering is texturing the surface of either the optical input electrode 32 (or 14) or the absorber 28 when it is established on the optical input electrode 32.

Figure 8:
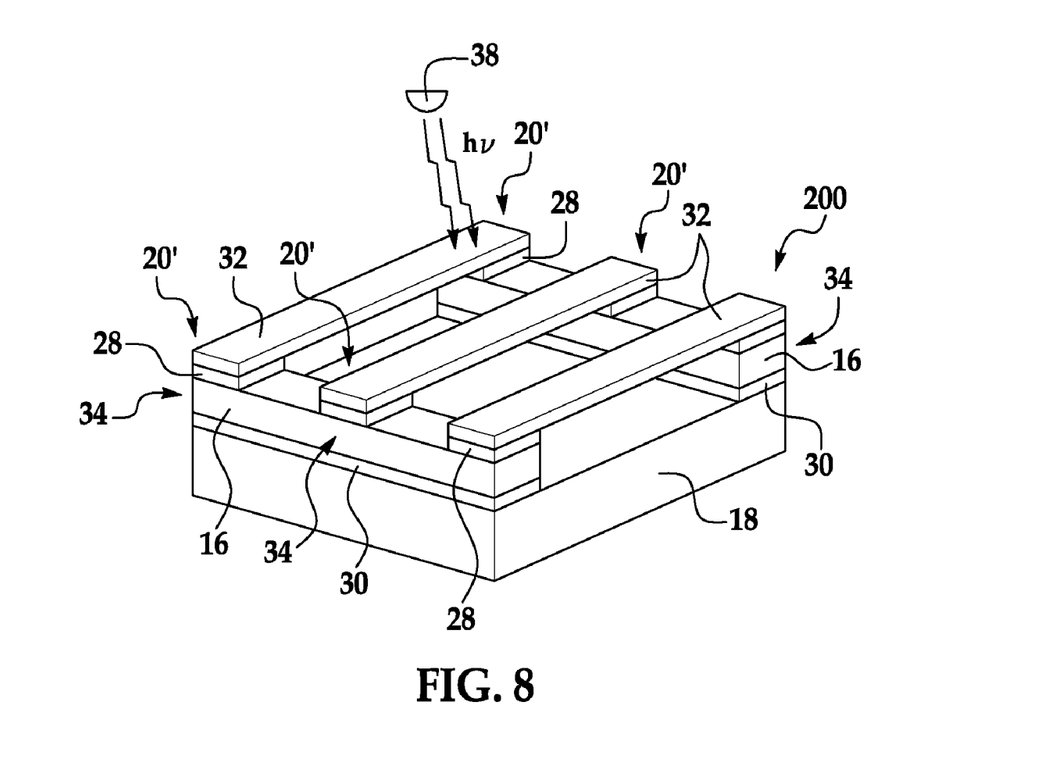
FIG. 8 is a semi-schematic perspective view of an embodiment of an array including a plurality of one embodiment of the vertical devices.

Referring now to FIG. 8, an array 200 is shown in which multiple devices 20' are established on a single substrate 18. Each device 20' is formed using the materials and methods described for the embodiment of FIG. 4. It is to be understood that the embodiments of the device 20, 20', 20'', 20''' discussed in FIGS. 3, 5, 6 and 7 may also be incorporated into an array 200. Combination of the devices 20, 20', 20'', 20''' may also be incorporated into a single array 200. It is to be further understood that any number of devices 20, 20', 20'' and/or 20''' may be incorporated onto the substrate 18 (which may depend, at least in part, upon the size of the substrate 18 and/or the device 20, 20', 20'', 20''').

It is to be understood that by incorporating a plurality of devices 20' into a single array 200, respective areas of the active region 16 may be selectively activated by exposing particular junctions 34 to optical pulses or electrical pulses. For example, light may be directed toward a single junction 34 (or a selective number of junctions 34), while the other junctions 34 remain unexposed and the corresponding devices 20' remain in an optical detecting state. Likewise, light may be directed toward all of the junctions 34 of all of the devices 20', and thus all of the devices 20' may be optically activated simultaneously.

When reading switching events within the array 200, it is to be understood that all devices 20' may be read or reset simultaneously, or devices 20' may be selectively read or reset. More particularly, in the crossbar geometry, a single device 20' per line (i.e., along one electrode 30 or 32) can be read at a time. This is generally due to the fact that other devices 20' on that line (i.e., electrode 30 or 32) need to be half selected so that they are not contributing a current to the read operation. For an example of selective resetting, an appropriate voltage may be selectively applied across one or more of the respective junction(s) 34 in order to drive the dopants through the conduction channel and transmit the associated device(s) 20' back into the optically active state.

It is to be understood that while the active region 16 is shown as being established along the respective electrodes 30, the active region 16 also be established on the entire substrate 18 surface. It is to be further understood that even if the active region 16 is established on the entire substrate 18 surface, only those regions between the electrodes 30, 32 will be optically and electrically actuatable.

The embodiments of the device 10, 10', 20, 20', 20'', 20''' (and/or array 100, 200) are advantageously capable of being both optically and electrically actuated. In particular, and as discussed hereinabove, the optical switching event may occur while the device 10, 10', 20, 20', 20'', 20''' (and array/or 100, 200) is entirely passive. Optical switching is accomplished by transmitting light from the light source 38 toward the active region 16 in the junction 22, 34, which is concentrated by virtue of the electrodes 12 and 14 or 30 and 32, in combination with the concentrator (i.e., the waveguide 24, the absorber 28 (alone or in conjunction with the anti-reflective coating 36 or the thickness T of the active region 16), or the thickness T of the active region 16 alone. The wavelength of the light used will depend, at least in part, upon the material(s) (and the corresponding absorbing properties) used for the optical input electrodes 14 or 32 and/or the absorber 28. In one embodiment, the wavelength is below those associated with deep ultraviolet light.

In one embodiment, the active region 16 in or adjacent one or more of the junctions 22, 34 is heated (by the optical pulse(s)) to 250° C. or more in order to locally initiate the optical switching event.

Furthermore, due, at least in part, to the fact that the occurrence of the event switches the electrical properties of the device 10, 20 (i.e., the resistance), the event can be read out at a much later time (ms, days, etc.) when electrical power is available for readout. The device 10, 20 can then be electrically switched back to its optical detecting state electronically. In any of the embodiments disclosed herein, when it is desirable to reset or switch the device 10, 20 back to the optical detecting state, an appropriate voltage is applied across the junction(s) 22, 34 in order to drive the dopants through the conduction channel. The voltage applied will depend, at least in part, on the dopants used and their concentration, and on the material used for the active region 16. Non-limiting examples of such voltages range from about 100 mV (millivolts) to about 20 V (volts). It is to be understood that during device 10, 20 operation, the areas of the active region 16 not directly adjacent the electrodes 12, 14 or 30, 32 do not change. Furthermore, the electric field between the electrodes 12, 14 or 30, 32 in the device 10, 20 during an electrical write or reset operation should generally be larger than about 10 kV/cm (kilovolts/centimeter).

While several embodiments have been described in detail, it will be apparent to those skilled in the art that the disclosed embodiments may be modified. Therefore, the foregoing description is to be considered exemplary rather than limiting.

What is claimed is:
1. An optically and electrically actuatable device, comprising:
   an insulating substrate;
   two electrodes, at least one of the two electrodes established on the insulating substrate and an other of the two electrodes established a spaced distance laterally from the at least one of the two electrodes, the other of the two electrodes being an optical input electrode;

an active region established on the insulating substrate and beneath the two electrodes; and a concentrator optically coupled to the optical input electrode for concentrating incident light such that a predetermined portion of the active region is optically actuatable; wherein:

the device is laterally oriented;

the optical input electrode is established on the active region at a spaced distance from the at least one of the two electrodes; and the concentrator includes:

a waveguide established on the active region such that the waveguide is optically coupled with the optical input electrode and is optically insulated from the active region.

2. The optically and electrically actuatable device as defined in claim 1 wherein the waveguide has an index of refraction that is greater than an index of refraction of the active region.

3. The optically and electrically actuatable device as defined in claim 1, further comprising an optical buffer layer established between the waveguide and the active region.

4. The optically and electrically actuatable device as defined in claim 1 wherein the concentrator further includes an optical absorbing layer established in at least a portion of the spaced distance between the two electrodes.

5. The optically and electrically actuatable device as defined in claim 4 wherein the optical absorbing layer has a cross-section that is sufficient to have incident thereon an entire optical beam from the waveguide.

6. The optically and electrically actuatable device as defined in claim 4, further comprising:

at least two other electrodes established on the active region at a spaced distance from each other, one of the at least two other electrodes being an other optical input electrode;

an other optical absorbing layer established in at least a portion of the spaced distance between the at least two other electrodes; and a waveguide established on the active region such that the waveguide is optically coupled with the other optical input electrode and is optically insulated from the active region.

7. The optically and electrically actuatable device as defined in claim 1 wherein each of the two electrodes is an absorbing electrode.

8. The optically and electrically actuatable device as defined in claim 1 wherein the active region is selected from materials having mobile dopants therein.

9. An optically and electrically actuatable device, comprising:

an insulating substrate;

two electrodes, at least one of the two electrodes established on the insulating substrate and an other of the two electrodes established a spaced distance vertically from the at least one of the two electrodes, the other of the two electrodes being an optical input electrode;

an active region established between the two electrodes; and a concentrator optically coupled to the optical input electrode for concentrating incident light such that a predetermined portion of the active region is optically actuatable; wherein:

the device is vertically oriented;

the optical input electrode is an at least partially transparent electrode crossing the at least one of the two electrodes at a non-zero angle, thereby forming a junction therebetween;

the active region has a predetermined thickness and is established in the junction; and the concentrator is configured to concentrate incident light at the junction.

10. The optically and electrically actuatable device as defined in claim 9 wherein the predetermined thickness of the active region is configured to create standing waves between the at least one of the two electrodes and the optical input electrode at the junction, and thus is the concentrator which concentrates the incident light at the junction.

11. The optically and electrically actuatable device as defined in claim 10 wherein the predetermined thickness is such that a total optical path length between the two electrodes is $\frac{1}{2}\lambda$, wherein $\lambda$ is a wavelength of the incident light.

12. The optically and electrically actuatable device as defined in claim 9, further comprising a conductive optical absorbing layer established between the optical input electrode and the active region, the conductive optical absorbing layer being the concentrator configured to concentrate the incident light at the junction.

13. The optically and electrically actuatable device as defined in claim 12, further comprising an anti-reflective coating established on the optical input electrode.

14. The optically and electrically actuatable device as defined in claim 12 wherein the predetermined thickness of the active region is configured to create standing waves between the at least one of the two electrodes and the optical input electrode at the junction, and thus is configured to, in conjunction with the conductive optical absorbing layer, concentrate at least some of the incident light at the junction.

15. The optically and electrically actuatable device as defined in claim 9, further comprising an optical absorbing layer established on the optical input electrode at a side opposed to the junction, the optical absorbing layer being the concentrator configured to concentrate the incident light at the junction.

16. The optically and electrically actuatable device as defined in claim 9, further comprising:

an other electrode established on the insulating substrate;

an other optical input electrode crossing the other electrode at a non-zero angle, thereby forming an other junction therebetween;

an other active region having a predetermined thickness and established in the junction; and an other concentrator configured to concentrate incident light at the junction.

17. A method for programming an optically and electrically actuatable device, the method comprising:

providing, in an electrically passive state, the optically and electrically actuatable device of claim 1; and exposing the concentrator to an optical pulse, thereby localizing heating of the predetermined portion of the active region and initiating a switching event therein which causes an electrical property of the provided device to change.

18. The method as defined in claim 17 wherein at a time subsequent to the exposing, the method further comprises measuring a current or voltage of the predetermined portion of the active region, thereby reading the switching event.

19. The method as defined in claim 17, further comprising electrically switching the provided device back to the electrically passive state.

20. The optically and electrically actuatable device as defined in claim 9 wherein the active region is selected from materials having mobile dopants therein.

21. A method for programming an optically and electrically actuatable device, the method comprising:
 providing, in an electrically passive state, the optically and electrically actuatable device of claim 9; and
 exposing the concentrator to an optical pulse, thereby localizing heating of the predetermined portion of the active region and initiating a switching event therein which causes an electrical property of the provided device to change.

* * * * *